(12) United States Patent
Kim et al.

(10) Patent No.: US 12,144,149 B2
(45) Date of Patent: Nov. 12, 2024

(54) COOLING APPARATUS FOR ELECTRONIC ELEMENT

(71) Applicant: KMW INC., Hwaseong-si (KR)

(72) Inventors: Duk Yong Kim, Yongin-si (KR); Jin Soo Yeo, Hwaseong-si (KR); Kyu Chul Choi, Hwaseong-si (KR); In Hwa Choi, Yongin-si (KR); Youn Jun Cho, Hwaseong-si (KR); Jeong Hyun Choi, Hwaseong-si (KR); Jae Hyun Park, Hwaseong-si (KR)

(73) Assignee: KMW INC., Hwaseong-si (KR)

( * ) Notice: Subject to any disclaimer, the term of this patent is extended or adjusted under 35 U.S.C. 154(b) by 254 days.

(21) Appl. No.: 17/864,424

(22) Filed: Jul. 14, 2022

(65) Prior Publication Data

US 2022/0354018 A1 Nov. 3, 2022

Related U.S. Application Data

(63) Continuation of application No. PCT/KR2021/000454, filed on Jan. 13, 2021.

(30) Foreign Application Priority Data

Jan. 15, 2020 (KR) .................. 10-2020-0005633

(51) Int. Cl.
*H05K 7/20* (2006.01)
*H01Q 1/02* (2006.01)
*H01Q 1/42* (2006.01)

(52) U.S. Cl.
CPC ........... *H05K 7/20309* (2013.01); *H01Q 1/02* (2013.01); *H01Q 1/42* (2013.01); *H05K 7/20318* (2013.01);

(Continued)

(58) Field of Classification Search
CPC ............. H05K 7/2029; H05K 7/20309; H05K 7/20318; H05K 7/20327; H05K 7/20345;

(Continued)

(56) References Cited

U.S. PATENT DOCUMENTS 7,150,109 B2 * 12/2006 Knight ................. H05K 7/1425
361/698
2002/0163782 A1 * 11/2002 Cole ................... H05K 7/20345
361/700

(Continued)

FOREIGN PATENT DOCUMENTS

CN 109612314 A 4/2019
CN 209744728 U 12/2019

(Continued)

OTHER PUBLICATIONS

International Search Report mailed Apr. 27, 2021 for International Application No. PCT/KR2021/000454 and its English translation.

(Continued)

*Primary Examiner* — Zachary Pape
*Assistant Examiner* — Steven Ngo
(74) *Attorney, Agent, or Firm* — Insight Law Group, PLLC; Seung Lee

(57) ABSTRACT

A cooling apparatus for an electronic element includes a first chamber in a non-vacuum state, the first chamber being configured such that a printed circuit board equipped with a heat-generating element is disposed in the first chamber, a second chamber in a vacuum state, the second chamber being configured such that a spray unit configured to spray a refrigerant and a refrigerant supply unit configured to supply the refrigerant to the spray unit are disposed in the second chamber, and an evaporation unit disposed between the first chamber and the second chamber, in which the spray unit sprays the refrigerant, which is supplied by the refrig- (Continued)

erant supply unit and condensed in the second chamber, into the second chamber, and in which the evaporation unit evaporates the refrigerant, which is sprayed into the second chamber by the spray unit.

18 Claims, 13 Drawing Sheets

(52) U.S. Cl.
CPC ..... *H05K 7/20345* (2013.01); *H05K 7/20409* (2013.01); *H05K 7/20327* (2013.01)
(58) Field of Classification Search
CPC ............. H05K 7/2039; H05K 7/20409; H05K 2201/06; H05K 2201/064; H04B 1/02; H04B 1/03; H04B 1/036; H01L 23/34; H01L 23/46; H01L 23/473; H01L 23/4735; H01Q 1/42; H01Q 1/02; F28D 5/00; F28D 5/02; F28D 2021/0061–0085
See application file for complete search history.

(56) References Cited

U.S. PATENT DOCUMENTS

| | | | |
|---|---|---|---|
| 2004/0250999 | A1 | 12/2004 | Kramer et al. |
| 2005/0056030 | A1* | 3/2005 | Bash ................... H01L 23/4735 62/304 |
| 2006/0130506 | A1* | 6/2006 | Tain ........................ F25B 39/02 257/E23.1 |
| 2006/0225447 | A1* | 10/2006 | Yamamoto .............. F25B 41/24 62/197 |
| 2011/0079376 | A1 | 4/2011 | Loong et al. |
| 2016/0118317 | A1* | 4/2016 | Shedd ....................... F28F 9/26 257/712 |
| 2017/0115071 | A1 | 4/2017 | Lin |

FOREIGN PATENT DOCUMENTS

| | | |
|---|---|---|
| EP | 3570299 A | 11/2019 |
| JP | 2003-298270 A | 10/2003 |
| JP | 2006-012874 A | 1/2006 |
| JP | 2011-023457 A | 2/2011 |
| JP | 2012-054498 A | 3/2012 |
| JP | 2012-222277 A | 11/2012 |
| JP | 2013-122369 A | 6/2013 |
| JP | 2013-243277 A | 12/2013 |
| JP | 2015-154057 A | 8/2015 |
| JP | 2015-220363 A | 12/2015 |
| JP | 2016-092173 A | 5/2016 |
| JP | 2018-125497 A | 8/2018 |
| KR | 10-2018-0118549 A1 | 10/2018 |
| WO | 02/046677 A1 | 6/2002 |
| WO | 2015/115688 A1 | 8/2015 |
| WO | 2018/043442 A1 | 3/2018 |
| WO | 2019/017297 A1 | 1/2019 |

OTHER PUBLICATIONS

Non-final Office Action mailed Sep. 5, 2023 from the Japanese Patent Office for Japanese Application No. 2022-542756.
Extended European Search Report mailed on May 21, 2024 from the European Patent Office for European Application No. 21740935.8.
Final Office Action mailed on Aug. 6, 2024 from the Japanese Patent Office for Japanese Application No. 2022-542756.

\* cited by examiner

COOLING APPARATUS FOR ELECTRONIC ELEMENT

CROSS-REFERENCE TO RELATED APPLICATIONS

This application is a continuation application of International Application No. PCT/KR2021/000454, filed Jan. 13, 2021, which claims the benefit of Korean Patent Application No. 10-2020-0005633, filed Jan. 15, 2020 in the Korean Intellectual Property Office, the disclosures of which are incorporated herein in their entirety by reference.

TECHNICAL FIELD

The present invention relates to a cooling apparatus for an electronic element, and more particularly, to a cooling apparatus for an electronic element that dissipates heat generated by a heat source such as an antenna element mounted on a printed circuit board.

BACKGROUND ART

In general, as an example of wireless communication technologies, a multiple-input/multiple-output (MIMO) technology refers to a technology for innovatively increasing data transmission capacity by using a plurality of antennas. This technology uses a spatial multiplexing technique, in which a transmitter transmits different data through the respective transmitting antennas, and a receiver distinguishes the transmitted data by performing appropriate signal processing.

Therefore, it is possible to transmit a larger amount of data by increasing both the number of transmitting antennas and the number of receiving antennas and thus increasing channel capacities. For example, if the number of antennas increases to ten, the channel capacity of about 10 times is ensured by using the same frequency band in comparison with the current single antenna system.

Eight antennas are used in 4G LTE-advanced, and a product equipped with 64 or 128 antennas has been developed in a current pre-5G step. It is expected that base station equipment having a much larger number of antennas will be used in 5G, which refers to a massive MIMO technology. The current cell management is 2-dimension, but 3D-beamforming may be enabled when the massive MIMO technology is introduced, which also represents a full-dimension (FD) MIMO.

In the massive MIMO technology, the number of transmitters and the number of filters are increased as the number of antennas is increased. Nevertheless, because of cost of lease or spatial restriction in respect to an installation location, RF components (antennas, filters, power amplifiers, transceivers, etc.) need to be practically manufactured to be small in size, light in weight, and inexpensive, and the massive MIMO requires a high output to expand a coverage. However, electric power consumption and heat generation, which are caused by the high output, have a negative effect on reductions in weight and size.

In particular, to install the MIMO antenna, in which modules including RF elements and digital elements are coupled in a layered structure, in a limited space, there is a need for a compact and small-scale design of a plurality of layers constituting the MIMO antenna in order to maximize ease of installation or spatial utilization. In this case, there is a need for a new design of a heat dissipation structure for dissipating heat generated by communication components mounted on the plurality of layers.

Korean Patent Application Laid-Open No. 10-2019-0118979 (published on Oct. 21, 2019, hereinafter, referred to as 'the related art') discloses a 'multiple-input/multiple-output antenna apparatus' that adopts a heat dissipation structure for a compact and small-scale design of a plurality of layers constituting a MIMO antenna.

The related art includes a heat dissipation main body having protruding heat dissipation fins, and a plurality of unit heat dissipation bodies installed on the heat dissipation main body. The plurality of unit heat dissipation bodies each having one end being in contact with a heat-generating element of an antenna substrate, and a plurality of sub-heat dissipation fins are provided at the other end of each of the plurality of unit heat dissipation bodies and dissipate heat transferred from the heat-generating element to the outside.

However, in the related art, the structure for dissipating heat from the heat-generating element is configured only as a mechanical structure that is an air-cooled heat dissipation structure configured to exchange heat with outside air. For this reason, it is difficult to quickly dissipate the heat, and a large number of mechanical heat dissipation structures are required to quickly dissipate the heat, which causes a problem of an increase in size.

DISCLOSURE

Technical Problem

A technical object of the present invention is to provide a cooling apparatus for an electronic element having improved heat dissipation performance while minimizing the size.

Another technical object of the present invention is to provide a cooling apparatus for an electronic element capable of quickly dissipating heat generated by a heat-generating element by spraying a refrigerant into a space in which the heat-generating element is disposed, and quickly evaporating the sprayed refrigerant.

The technical problems of the present invention are not limited to the aforementioned technical problem, and other technical problems, which are not mentioned above, may be clearly understood by those skilled in the art from the following descriptions.

Technical Solution

To achieve the objects, a cooling apparatus for an electronic element according to the present invention includes a first chamber, a second chamber, and an evaporation unit. A printed circuit board is disposed in the first chamber. A heat-generating element is mounted on the printed circuit board. The first chamber is in a non-vacuum state. A spray unit and a refrigerant supply unit are disposed in the second chamber. The spray unit sprays a refrigerant. The refrigerant supply unit supplies the refrigerant to the spray unit. The evaporation unit is disposed between the first chamber and the second chamber. The spray unit sprays the refrigerant, which is supplied by the refrigerant supply unit and condensed in the second chamber, into the second chamber. The evaporation unit evaporates the refrigerant, which is sprayed into the second chamber by the spray unit, by using sensible heat transferred from the first chamber to the evaporation unit and latent heat transferred from the evaporation unit to the second chamber.

The evaporation unit may include a partition frame and a heat exchange member. The partition frame may separate the first chamber and the second chamber. The heat exchange member may be coupled to the partition frame and disposed in the second chamber. The heat exchange member may evaporate the refrigerant, which is sprayed into the second chamber by the spray unit, by using the sensible heat and the latent heat.

The cooling apparatus for an electronic element according to the present invention may further include a radome and a heat dissipation cover. The radome may be disposed on one surface of the partition frame. The heat dissipation cover may be disposed on the other surface of the partition frame. The first chamber may be provided between the partition frame and the radome. The second chamber may be provided between the partition frame and the heat dissipation cover.

The heat exchange member may include a body and a plurality of heat exchange protrusions. The body may have a plate shape. The body may be disposed on the partition frame. The plurality of heat exchange protrusions may be formed on one surface of the body.

The heat exchange member may include a body and a plurality of heat exchange grooves. The body may have a plate shape. The body may be disposed on the partition frame. The plurality of heat exchange grooves may be formed in one surface of the body.

The body insertion groove may be formed in the partition frame. The body may be inserted into the body insertion groove.

The heat exchange member may be configured as a porous powder sintered body.

The printed circuit board may be provided as one or more printed circuit boards. The heat exchange member may be provided as one or more heat exchange members disposed, one for each of the printed circuit boards.

The heat exchange protrusion may have a bar shape having a polygonal cross-section.

The heat exchange protrusion may have a bar shape having a circular cross-section.

The heat exchange groove may have a bar shape debossed in the body and having a polygonal cross-section.

The heat exchange groove may have a bar shape deposed in the body and having a circular cross-section.

A plurality of heat dissipation fins may protrude from an outer surface of the heat dissipation cover that corresponds to the other surface of the partition frame.

The cooling apparatus for an electronic element according to the present invention may further include a condensing unit. The condensing unit may be disposed outside the heat dissipation cover. The condensing unit may have a tubular shape. The condensing unit may condense the evaporated refrigerant in the second chamber and supply the refrigerant to the refrigerant supply unit.

The condensing unit may have a bellows shape.

The cooling apparatus for an electronic element according to the present invention may further include a mounting bracket. The mounting bracket may have a through-hole penetrated by the condensing unit. The mounting bracket may be disposed outside the heat dissipation cover.

An outflow unit may protrude from an upper portion of the heat dissipation cover. The evaporated refrigerant in the second chamber may flow out through the outflow unit. An inflow unit may protrude from a lower portion of the heat dissipation cover. The refrigerant condensed by the condensing unit may flow into the second chamber through the inflow unit. The condensing unit may connect the outflow unit and the inflow unit.

The cooling apparatus for an electronic element according to the present invention may further include a vacuum gauge and a manometer. The vacuum gauge may create a vacuum in the radome. The manometer may measure a pressure in the radome.

The cooling apparatus for an electronic element according to the present invention may further include a vacuum gauge and a manometer. The vacuum gauge may create a vacuum in the second chamber. The manometer may measure a pressure in the second chamber.

The spray unit, the refrigerant supply unit, the vacuum gauge, and the manometer may be installed on the partition frame.

The heat-generating element may include at least one of an antenna element and a radio unit (RU). The antenna element may transmit and receive a wireless signal. The radio unit may process the wireless signal.

Other detailed matters of the embodiment are included in the detailed description and the drawings.

Advantageous Effects

In the cooling apparatus for an electronic element according to the present invention, the spray unit sprays the refrigerant, which is supplied by the refrigerant supply unit and condensed in the second chamber, into the second chamber in a vacuum state, and the evaporation unit evaporates the refrigerant, which is sprayed into the second chamber by the spray unit, by using the sensible heat transferred from the first chamber to the evaporation unit and using the latent heat transferred from the evaporation unit to the second chamber. Therefore, it is possible to quickly dissipate the heat, which is generated by the heat-generating element mounted on the printed circuit board disposed in the first chamber, by using a phase change of the refrigerant. Further, because it is not necessary to install a large number of mechanical air-cooled heat dissipation structures, the size of the cooling apparatus may decrease.

The effects of the present invention are not limited to the aforementioned effects, and other effects, which are not mentioned above, will be clearly understood by those skilled in the art from the claims.

DESCRIPTION OF MAIN REFERENCE NUMERALS OF DRAWINGS

Figure 1:
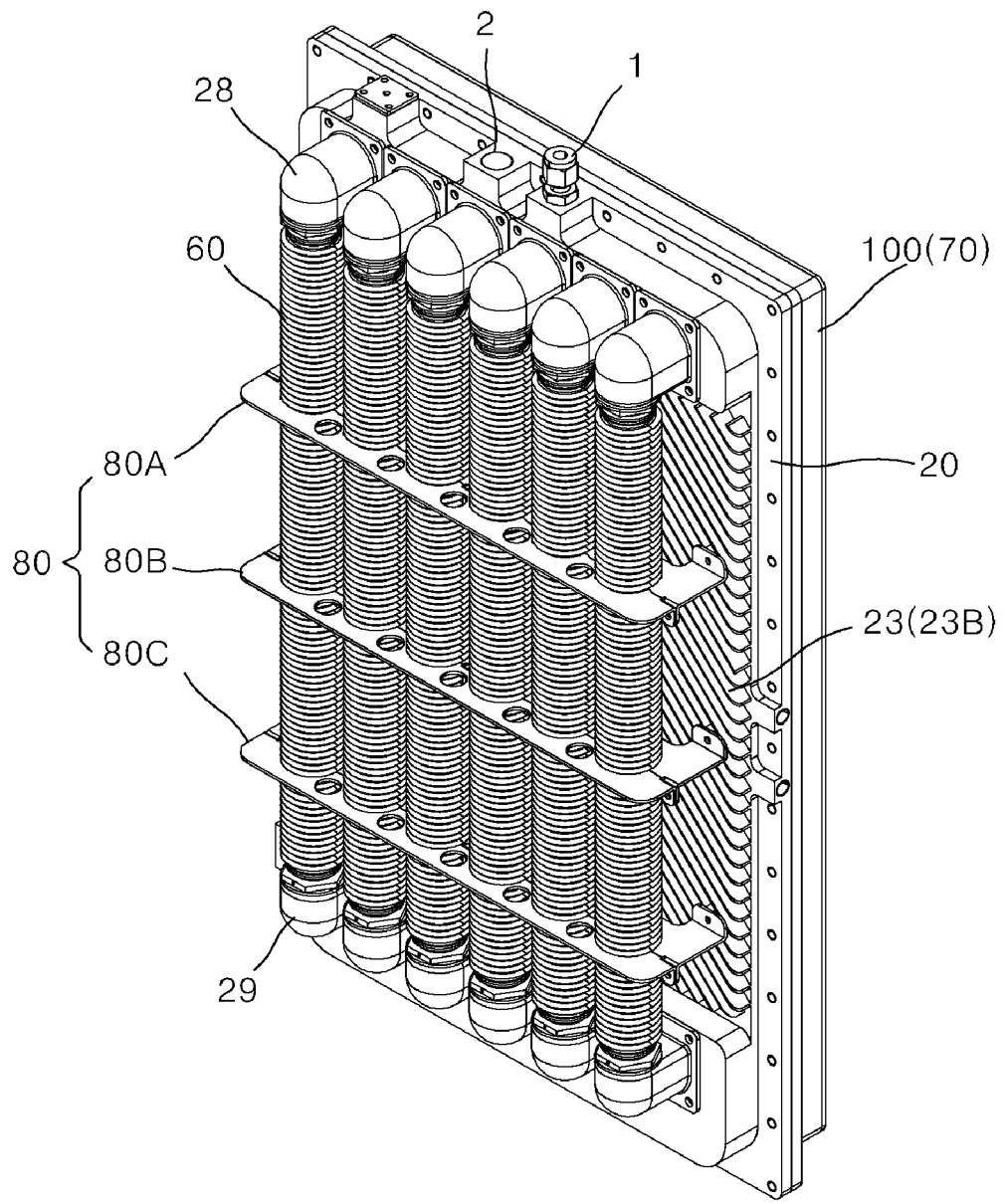
FIG. 1 is a rear perspective view illustrating a cooling apparatus for an electronic element according to an embodiment of the present invention.

1: Vacuum gauge
2: Manometer
10: Radome
20: Heat dissipation cover
28: Outflow unit
29: Inflow unit
30: Spray unit
40: Refrigerant supply unit
50, 500: Heat exchange member
51, 510: Body
52, 520: Heat exchange protrusion
60: Condensing unit
70: Partition frame
75: Body insertion groove
80: Mounting bracket
100: Evaporation unit
C1: First chamber
C2: Second chamber

BEST MODE

Hereinafter, a cooling apparatus for an electronic element according to an embodiment of the present invention will be described with reference to the drawings.

Figure 2:
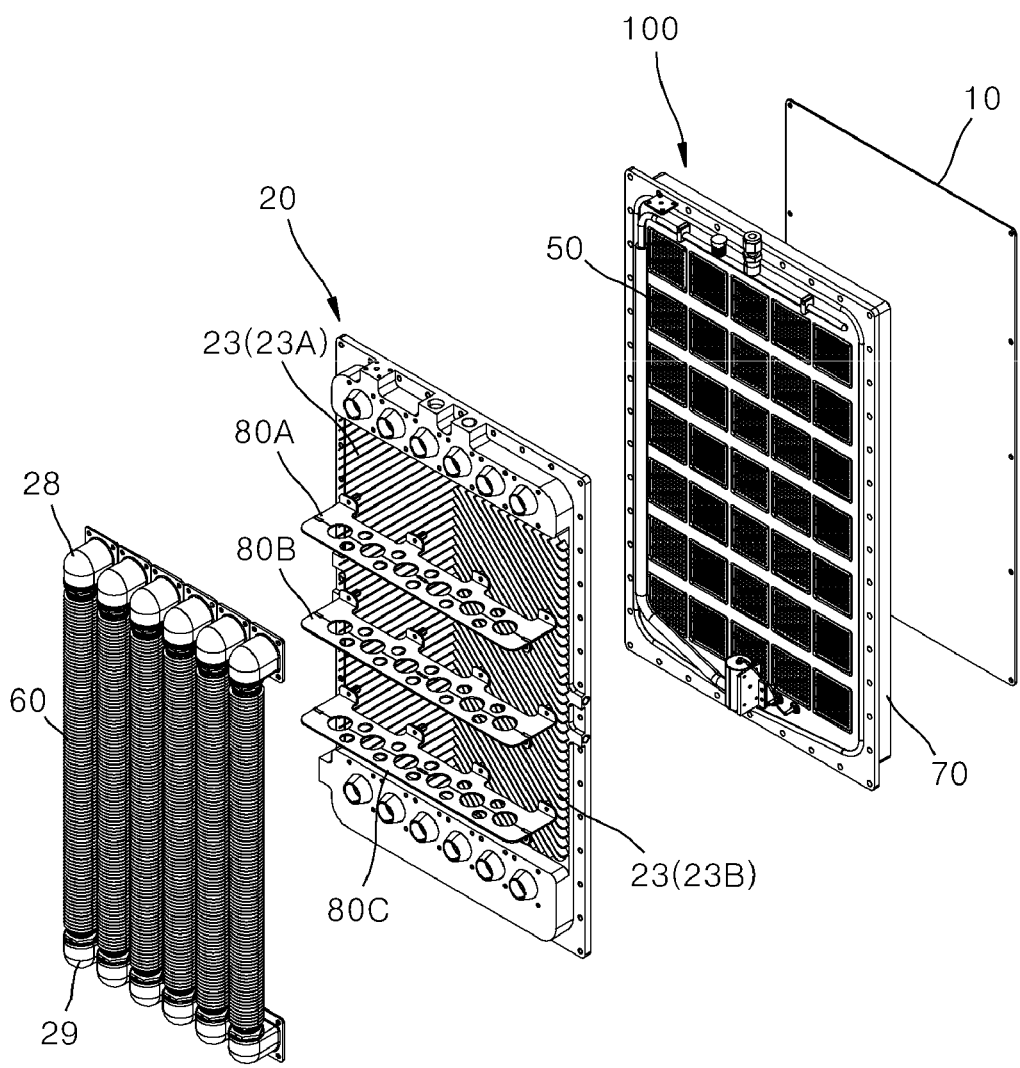
FIG. 2 is an exploded perspective view of FIG. 1.
Figure 3:
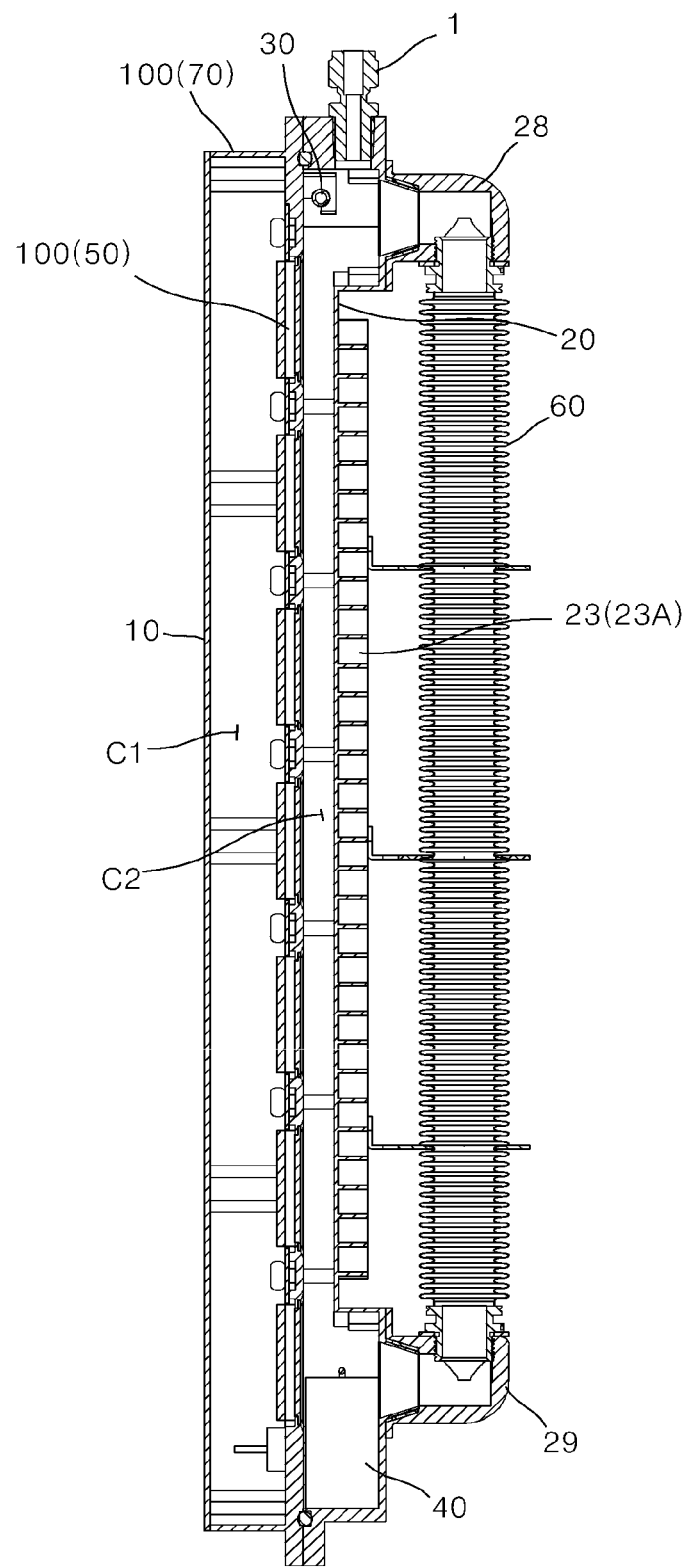
FIG. 3 is a side view illustrating the cooling apparatus for an electronic element according to the embodiment of the present invention.
Figure 4:
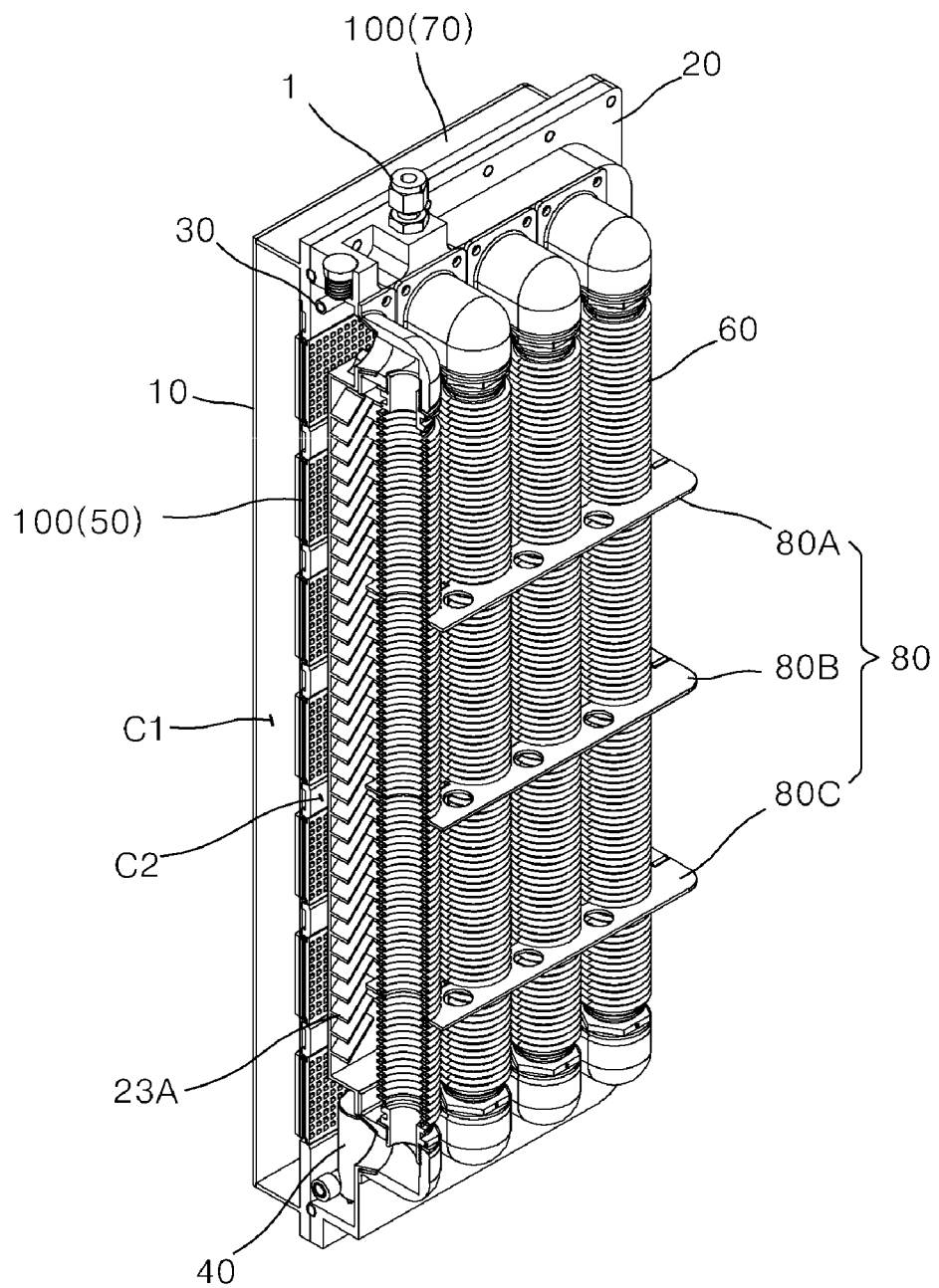
FIG. 4 is a side cut-away perspective view illustrating the cooling apparatus for an electronic element according to the embodiment of the present invention.
Figure 5:
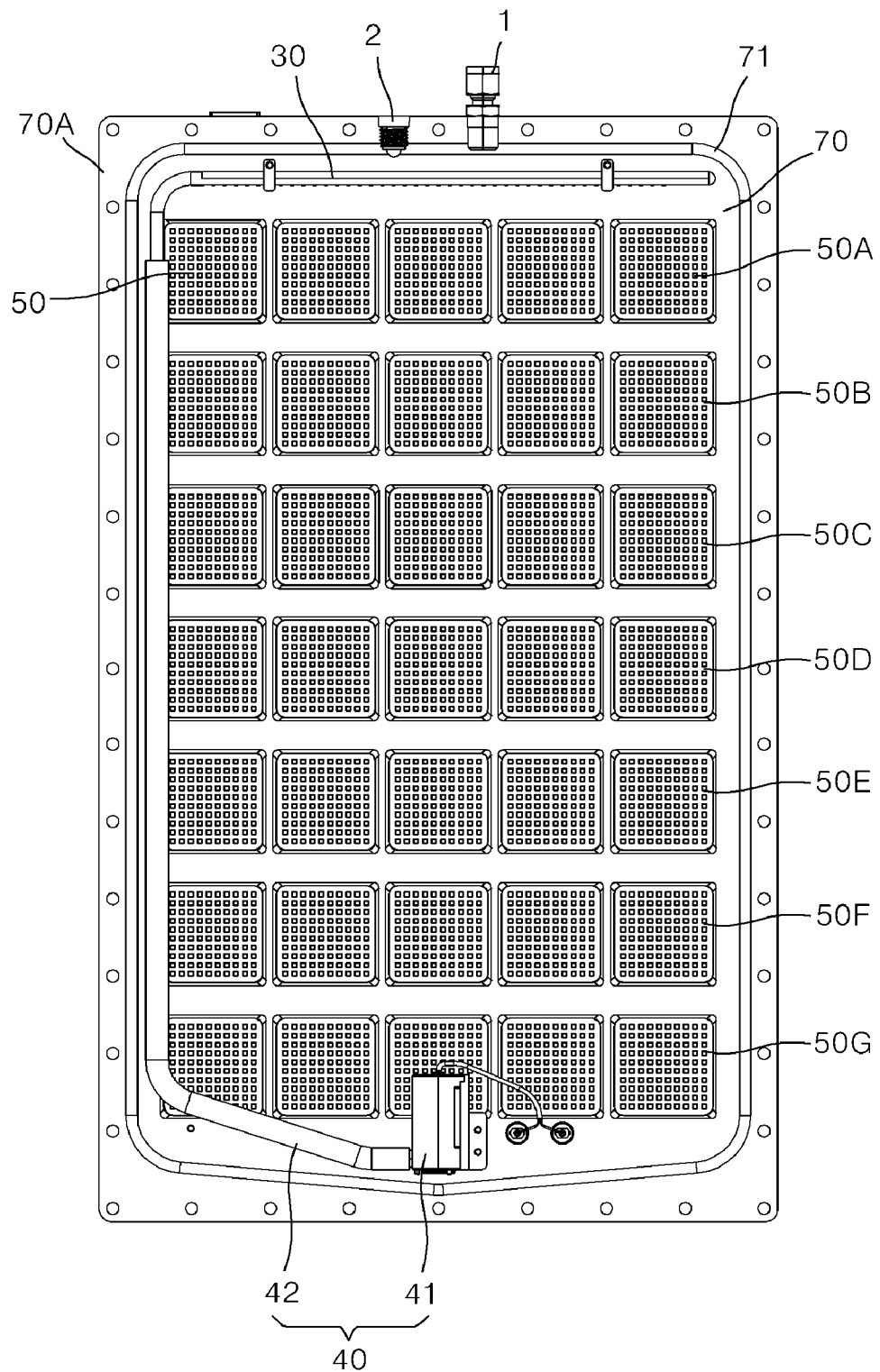
FIG. 5 is a rear view illustrating an evaporation unit illustrated in FIG. 2.

FIG. 1 is a rear perspective view illustrating a cooling apparatus for an electronic element according to an embodiment of the present invention, FIG. 2 is an exploded perspective view of FIG. 1, FIG. 3 is a side view illustrating the cooling apparatus for an electronic element according to the embodiment of the present invention, FIG. is a side cutaway perspective view illustrating the cooling apparatus for an electronic element according to the embodiment of the present invention, and FIG. 5 is a rear view illustrating an evaporation unit illustrated in FIG. 2.

Referring to FIGS. 1 to 5, the cooling apparatus for an electronic element according to the embodiment of the present invention may include a first chamber C1, a second chamber C2, and an evaporation unit 100.

A printed circuit board (not illustrated) may be disposed in the first chamber C1. A heat-generating element (not illustrated) may be mounted on the printed circuit board. The first chamber C1 may be in a non-vacuum state.

A spray unit 30 and the refrigerant supply unit 40 may be disposed in the second chamber C2. The spray unit 30 may spray a refrigerant. The refrigerant supply unit 40 may supply the refrigerant to the spray unit 30.

The evaporation unit 100 may be disposed between the first chamber C1 and the second chamber C2. The spray unit 30 may spray the refrigerant, which is supplied by the refrigerant supply unit 40 and condensed in the second chamber C2, into the second chamber C2. The evaporation unit 100 may evaporate the refrigerant, which is sprayed into the second chamber C2 by the spray unit 30, by using sensible heat transferred from the first chamber C1 to the evaporation unit 100 and latent heat transferred from the evaporation unit 100 to the second chamber C2.

The evaporation unit 100 may include a partition frame 70 and heat exchange members 50. The partition frame 70 may separate the first chamber C1 and the second chamber C2. The heat exchange member 50 may be coupled to the partition frame 70 and disposed in the second chamber C2. The heat exchange member 50 may evaporate the refrigerant, which is sprayed into the second chamber C2 by the spray unit 30, by using the sensible heat and the latent heat.

The cooling apparatus for an electronic element according to the embodiment of the present invention may further include a radome 10 and a heat dissipation cover 20. The radome 10 may be disposed on one surface of the partition frame 70. The heat dissipation cover 20 may be disposed on the other surface of the partition frame 70. The first chamber C1 may be provided between the partition frame 70 and the radome 10. The second chamber C2 may be provided between the partition frame 70 and the heat dissipation cover 20.

In this case, one surface of the partition frame 70 may be a front surface of the partition frame 70 based on the drawing. The other surface of the partition frame 70 may be a rear surface of the partition frame 70 based on the drawing. Hereinafter, one surface of each of all the components included in the cooling apparatus for an electronic element according to the embodiment of the present invention may be the front surface based on the drawings, and the other surface may be the rear surface based on the drawings.

The radome 10 may have a quadrangular plate shape. However, the shape of the radome 10 is not limited to the quadrangular plate shape. The radome 10 may have a circular plate shape or a polygonal plate shape.

The partition frame 70 may have a shape corresponding to the shape of the radome 10 and have an internal space opened at a front side thereof. The radome 10 may cover the opened front side of the partition frame 70. Therefore, the first chamber C1 may be provided between the front side of the partition frame 70 and the radome 10.

The structure of the partition frame 70 and the structure of the radome 10, which are provided to provide the first chamber C1 between the front side of the partition frame 70 and the radome 10, may be variously changed and carried out. For example, the radome 10 may have an internal space opened at a rear side thereof. In this case, the partition frame 70 may have a plate shape that covers the opened rear side of the radome 10.

The partition frame 70 and the heat dissipation cover 20 may be coupled to each other. The partition frame 70 may be disposed forward of the heat dissipation cover 20, the heat dissipation cover 20 may be disposed rearward of the partition frame 70. A first flange 70A may be formed at a rim of the partition frame 70. The first flange 70A may extend in an outward direction orthogonal to a lateral end of a main body of the partition frame 70. A second flange 20A (see FIG. 12) may be formed at a rim of the heat dissipation cover 20. The second flange 20A may extend in an outward direction orthogonal to a lateral end of a main body of the heat dissipation cover 20. The first flange 70A and the second flange 20A may be disposed to face each other and then coupled by means of fastening members such as bolts or screws. However, the method of fastening the first flange 70A and the second flange 20A is not limited thereto.

The heat dissipation cover 20 may have an internal space opened at a front side thereof. Therefore, when the first flange 70A and the second flange 20A are coupled, the second chamber C2 may be provided between the rear side of the partition frame 70 and the heat dissipation cover 20. The structure of the partition frame 70 and the structure of the heat dissipation cover 20, which are provided to provide the second chamber C2 between the rear side of the partition frame 70 and the heat dissipation cover 20 may be variously changed and carried out. For example, the partition frame 70 may have an internal space opened at a rear side thereof. In this case, the heat dissipation cover 20 may have a plate shape that covers the opened rear side of the partition frame 70.

The heat-generating element (not illustrated) may be mounted on the printed circuit board. The heat-generating elements may include all the electronic elements that are mounted on the printed circuit board and generate heat. The heat-generating element may be mounted on at least one of front and rear surfaces of the printed circuit board.

The heat-generating elements may include at least one of an antenna element and a radio unit (RU). The antenna element may transmit and receive wireless signals. The radio unit may process the wireless signal. When the heat-generating element is configured as the antenna element, the cooling apparatus for an electronic element according to the embodiment of the present invention may be a multiple-input/multiple-output antenna apparatus installed by a communication carrier that installs a base station. Alternatively, when the heat-generating element is configured as the radio unit, the cooling apparatus for an electronic element according to the embodiment of the present invention may be a wireless signal processing apparatus of a network equipment company that manufactures the base station.

The partition frame 70 may be made of a material excellent in thermal conduction performance in order to easily transfer the heat, which is generated by the heat-generating element and exists in the first chamber C1, to the heat exchange member 50. For example, the partition frame 70 may be made of aluminum.

The heat dissipation cover 20 may dissipate the heat in the second chamber C2 to the outside. The heat dissipation cover 20 may be made of a heat dissipation material excellent in heat dissipation performance. For example, the heat dissipation cover 20 may be made of aluminum.

A plurality of heat dissipation fins 23 may protrude from an outer surface of the heat dissipation cover 20. The plurality of heat dissipation fins 23 may protrude from a rear surface of the heat dissipation cover 20 that corresponds to the rear surface of the partition frame 70.

The plurality of heat dissipation fins 23 may dissipate the heat in the second chamber C2 by exchanging heat with outside air. In addition, the plurality of heat dissipation fins 23 may also serve to condense the refrigerant evaporated by the evaporation unit 100 and existing in the second chamber C2.

The plurality of heat dissipation fins 23 may include a plurality of first heat dissipation fins 23A and a plurality of second heat dissipation fins 23B. The plurality of first heat dissipation fins 23A may be disposed at one side based on a center of the rear surface of the heat dissipation cover 20, i.e., the outer surface of the heat dissipation cover 20. The plurality of second heat dissipation fins 23B may be disposed at the other side based on the center of the rear surface of the heat dissipation cover 20, i.e., the outer surface of the heat dissipation cover 20.

The plurality of first heat dissipation fins 23A may each be inclined so that a height thereof increases in a direction from one side of the rear surface of the heat dissipation cover 20 to the center of the rear surface of the heat dissipation cover 20. The plurality of second heat dissipation fins 23B may each be inclined so that a height thereof increases in a direction from the other side of the rear surface of the heat dissipation cover 20 to the center of the rear surface of the heat dissipation cover 20.

Of course, the heat dissipation fins 23 may be formed as a one-piece structure having left and right sides that are not distinguishable. Alternatively, the heat dissipation fins 23 may be separated in multiple stages. In addition, the heat dissipation fin 23 may have a height that increases in a direction toward the center. The heat dissipation fin 23 may be formed horizontally or vertically. The spray unit 30 may spray the refrigerant into the second chamber C2. The refrigerant supply unit 40 may supply the refrigerant to the spray unit 30. The spray unit 30 may spray the refrigerant, which is supplied from the refrigerant supply unit 40, into the second chamber C2. The spray unit 30 and the refrigerant supply unit 40 will be described in detail with reference to FIGS. 6 to 8.

Meanwhile, a vacuum gauge 1, which is configured to create a vacuum in the second chamber C2, and a manometer 2, which measures a pressure in the second chamber C2, may be installed on an upper surface of the partition frame 70.

The vacuum gauge 1 and the manometer 2 may be disposed to be spaced apart from each other in a leftward/rightward direction. The vacuum gauge 1 may be disposed leftward of the manometer 2, and the manometer 2 may be disposed rightward of the vacuum gauge 1. Alternatively, the vacuum gauge 1 may be disposed rightward of the manometer 2, and the manometer 2 may be disposed leftward of the vacuum gauge 1.

A control unit (not illustrated) configured to control the vacuum gauge 1 may be provided on the printed circuit board. The control unit may control a pump 41 to be described below on the basis of a pressure of the second chamber C2 measured by the manometer 2.

Meanwhile, the heat exchange member 50 may be coupled to the rear surface of the partition frame 70. The heat exchange member 50 may evaporate the refrigerant, which is sprayed by the spray unit 30 and exists in the second chamber C2, by exchanging heat with the heat generated by the heat-generating element. That is, the heat exchange member 50 may be heated by the sensible heat which is generated by the heat-generating element and transferred from the inside of the first chamber C1 to the partition frame 70. The refrigerant sprayed by the spray unit 30 may be adsorbed to the heated heat exchange member 50 and evaporated by the latent heat.

The heat exchange members 50 may include a plurality of heat exchange members 50.

Specifically, the plurality of heat exchange members 50 may include a plurality of first heat exchange members 50A, a plurality of second heat exchange members 50B, a plurality of third heat exchange members 50C, a plurality of fourth heat exchange members 50D, a plurality of fifth heat exchange members 50E, a plurality of sixth heat exchange members 50F, and a plurality of seventh heat exchange members 50G.

The plurality of heat exchange members 50 may be disposed to be spaced apart from one another in an upward/downward direction. That is, the plurality of first heat exchange members 50A, the plurality of second heat exchange members 50B, the plurality of third heat exchange members 50C, the plurality of fourth heat exchange members 50D, the plurality of fifth heat exchange members 50E, the plurality of sixth heat exchange members 50F, and the plurality of seventh heat exchange members 50G may be disposed to be spaced apart from one another in the upward/downward direction.

The plurality of first heat exchange members 50A, the plurality of second heat exchange members 50B, the plurality of third heat exchange members 50C, the plurality of fourth heat exchange members 50D, the plurality of fifth heat exchange members 50E, the plurality of sixth heat exchange members 50F, and the plurality of seventh heat exchange members 50G may each include five heat exchange members 50.

The plurality of first heat exchange members 50A may be disposed at the uppermost side among the heat exchange members 50. The plurality of first heat exchange members 50A may be disposed above the plurality of second heat exchange members 50B.

The plurality of second heat exchange members 50B may be disposed below the plurality of first heat exchange members 50A. The plurality of second heat exchange members 50B may be disposed above the plurality of third heat exchange members 50C. The plurality of second heat exchange members 50B may be disposed between the plurality of first heat exchange members 50A and the plurality of third heat exchange members 50C.

The plurality of third heat exchange members 50C may be disposed below the plurality of second heat exchange members 50B. The plurality of third heat exchange members 50C may be disposed above the plurality of fourth heat exchange members 50D. The plurality of third heat exchange members 50C may be disposed between the plurality of second heat exchange members 50B and the plurality of fourth heat exchange members 50D.

The plurality of fourth heat exchange members 50D may be disposed below the plurality of third heat exchange members 50C. The plurality of fourth heat exchange members 50D may be disposed above the plurality of fifth heat exchange members 50E. The plurality of fourth heat exchange members 50D may be disposed between the plurality of third heat exchange members 50C and the plurality of fifth heat exchange members 50E.

The plurality of fifth heat exchange members 50E may be disposed below the plurality of fourth heat exchange members 50D. The plurality of fifth heat exchange members 50E may be disposed above the plurality of sixth heat exchange members 50F. The plurality of fifth heat exchange members 50E may be disposed between the plurality of fourth heat exchange members 50D and the plurality of sixth heat exchange members 50F.

The plurality of sixth heat exchange members 50F may be disposed below the plurality of fifth heat exchange members 50E. The plurality of sixth heat exchange members 50F may be disposed above the plurality of seventh heat exchange members 50G. The plurality of sixth heat exchange members 50F may be disposed between the plurality of fifth heat exchange members 50E and the plurality of seventh heat exchange members 50G.

The plurality of seventh heat exchange members 50G may be disposed at the lowermost side among the heat exchange members 50. The plurality of seventh heat exchange members 50G may be disposed below the plurality of sixth heat exchange members 50F.

The heat exchange members 50 may be arranged in seven rows in the upward/downward direction and arranged in five columns in the leftward/rightward direction, such that the heat exchange members 50 may be arranged in seven rows and five columns as a whole. Therefore, a total number of heat exchange members 50 may be thirty-five. However, the number of heat exchange members 50 may be variously changed depending on the number of matrices in which the heat exchange member 50 are arranged.

A detailed structure of the heat exchange member 50 will be described below in detail with reference to FIGS. 10 and 11. First, detailed structures of the spray unit 30 and the refrigerant supply unit 40 will be described.

Figure 6:
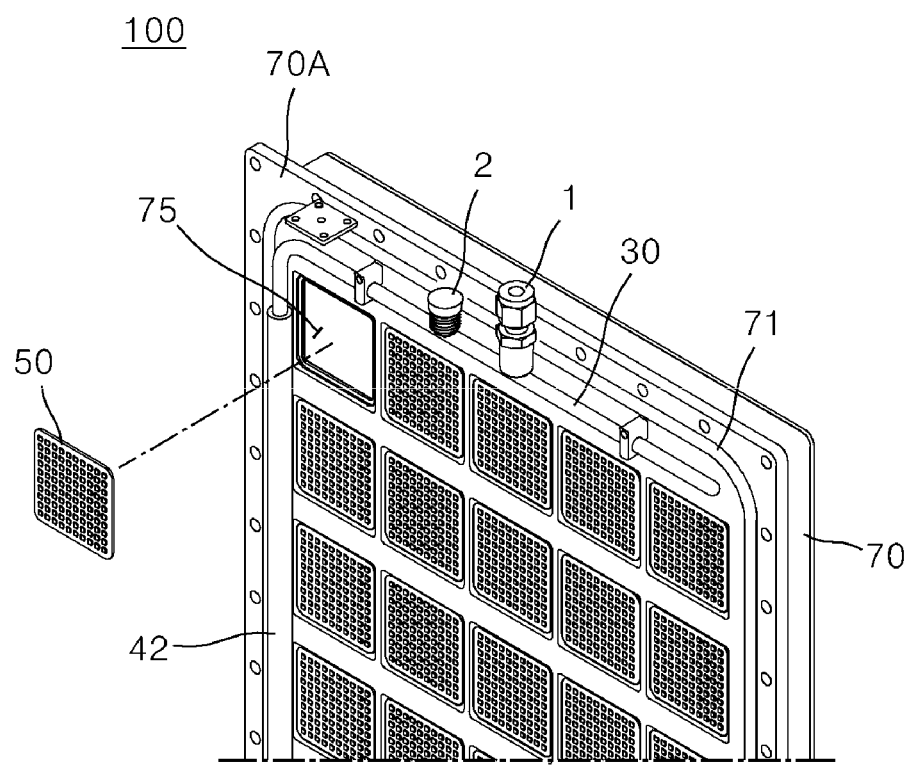
FIG. 6 is a perspective view illustrating an upper side of FIG. 5.
Figure 7:
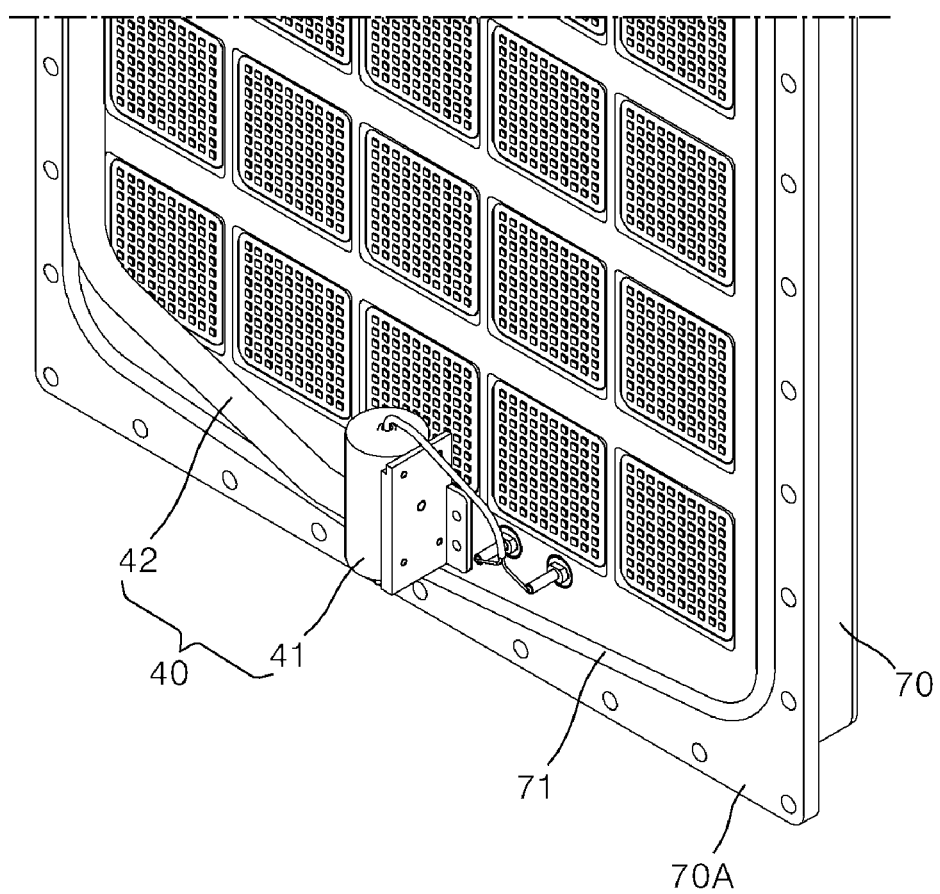
FIG. 7 is a perspective view illustrating a lower side of FIG. 5.
Figure 8:
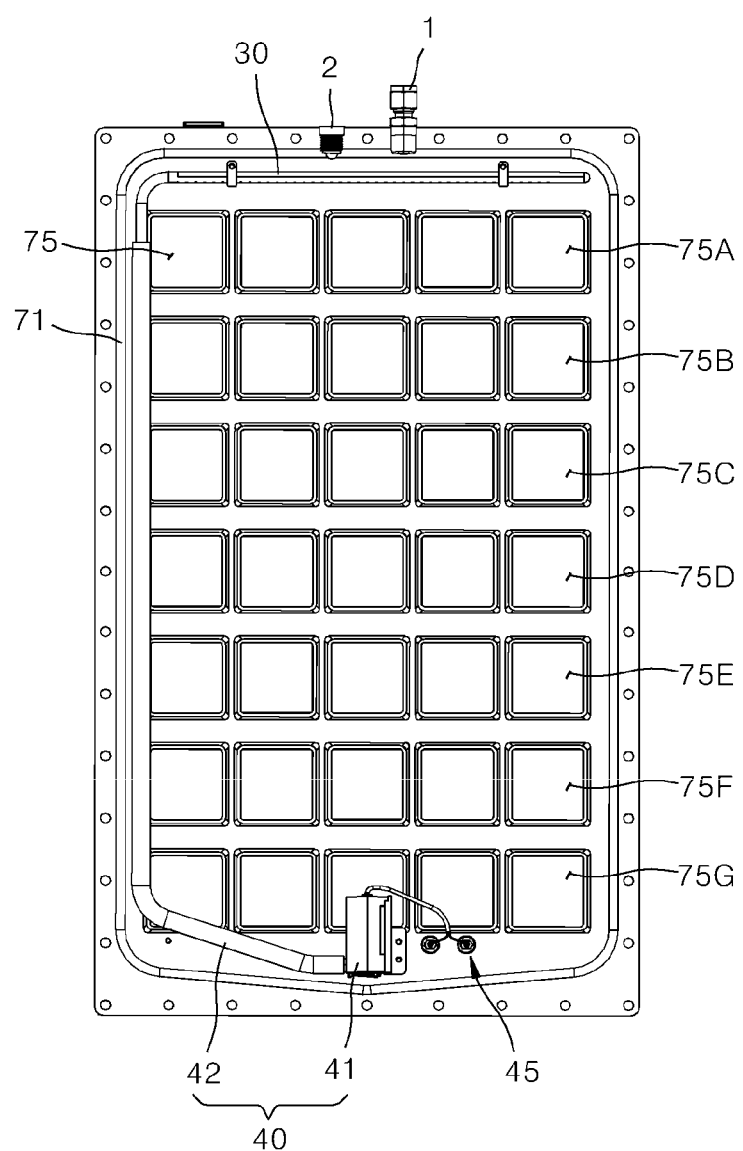
FIG. 8 is a view illustrating a state in which heat exchange members are removed from a rear surface of a partition frame illustrated in FIG. 5.

FIG. 6 is a perspective view illustrating an upper side of FIG. 5, FIG. 7 is a perspective view illustrating a lower side of FIG. 5, and FIG. 8 is a view illustrating a state in which the heat exchange members are removed from the rear surface of the partition frame illustrated in FIG. 5.

Referring to FIGS. 6 to 8, the spray unit 30 may have a plurality of spray ports (not illustrated) configured to spray the refrigerant into the second chamber C2. The spray unit 30 may be installed on the partition frame 70.

The spray unit 30 may be disposed above the heat exchange member 50 so that the refrigerant sprayed by the spray unit 30 may be easily adsorbed to the heat exchange members 50. Therefore, the spray unit 30 may be disposed at an uppermost portion of the partition frame 70 in the second chamber C2. In this case, the plurality of spray ports of the spray unit 30 may be formed at a lower side of the spray unit 30.

The spray unit 30 may be provided in the form of a tube elongated in the leftward/rightward direction. The plurality of spray ports of the spray unit 30 may be a plurality of spray ports spaced apart from one another along a length of the spray unit 30.

In addition, the spray unit 30 may be disposed to face the heat exchange members 50. In this case, the plurality of spray ports may be provided on a portion of the spray unit 30 that is directed toward the heat exchange members 50.

Diameters of the plurality of spray ports may decrease in a direction away from the refrigerant supply unit 40 so that the plurality of spray ports may spray the refrigerant with the same pressure.

The spray unit 30 may spray the refrigerant supplied from the refrigerant supply unit 40 through the plurality of spray ports. Alternatively, the spray unit 30 may spray the refrigerant in an atomized state.

The refrigerant supply unit 40 may supply the refrigerant, which is sprayed by the spray unit 30, evaporated by the heat exchange members 50, and then condensed, to the spray unit 30. The refrigerant evaporated by the heat exchange members 50 may be condensed and collected at a lower side in the second chamber C2. Therefore, the refrigerant supply unit 40 may be disposed at the lower side in the second chamber C2 in order to supply the spray unit 30 with the refrigerant collected at the lower side in the second chamber C2.

The refrigerant supply unit 40 may include the pump 41 disposed at the lower side in the second chamber C2, and a conveying tube 42 configured to supply the spray unit 30 with the condensed refrigerant pumped by the pump 41.

The pump 41 may include a brushless direct current (BLDC) motor. The pump 41 may be disposed may be provided at the lower side in the second chamber C2 and disposed at a portion in the vicinity of a center based on the leftward/rightward direction.

The conveying tube 42 may connect a refrigerant discharge port of the pump 41 and a refrigerant inlet port of the spray unit 30. That is, one end of the conveying tube 42 may be connected to the refrigerant discharge port of the pump 41. The other end of the conveying tube 42 may be connected to the refrigerant inlet port provided at one end of the spray unit 30.

The spray unit 30 may include a horizontal portion formed straight in the leftward/rightward direction and having the plurality of spray ports spaced apart from one another along the length thereof, and a first vertical portion bent from the horizontal portion, extending downward, and disposed vertically at one side of the partition frame 70.

The conveying tube 42 may include an inclined portion extending from the refrigerant discharge port of the pump 41 to one side of the partition frame 70 and extending to be inclined upward, and a second vertical portion extending upward straight from the inclined portion, disposed vertically at one side of the partition frame 70, and having an upper end connected to a lower end of the first vertical portion of the spray unit 30.

Meanwhile, a sealer 71 configured to seal a rim of the internal space of the heat dissipation cover 20 may be disposed on the rear surface of the partition frame 70. The sealer 71 may seal a portion between the rim of the internal space of the heat dissipation cover 20 and the rear surface of the partition frame 70.

In addition, the pump 41 includes an electric wire through which power for operating the pump 41 is inputted. The electric wire of the pump 41 needs to be connected to the printed circuit board on which the control unit configured to control the pump 41 is provided. To this end, the electric wire of the pump 41 may be installed on the partition frame 70 by a pump wire fastening unit 45 installed on the partition frame 70. The electric wire may be connected to the control unit of the printed circuit board disposed in the first chamber C1.

The pump wire fastening unit 45 will be described below in detail with reference to FIG. 9.

Figure 9:
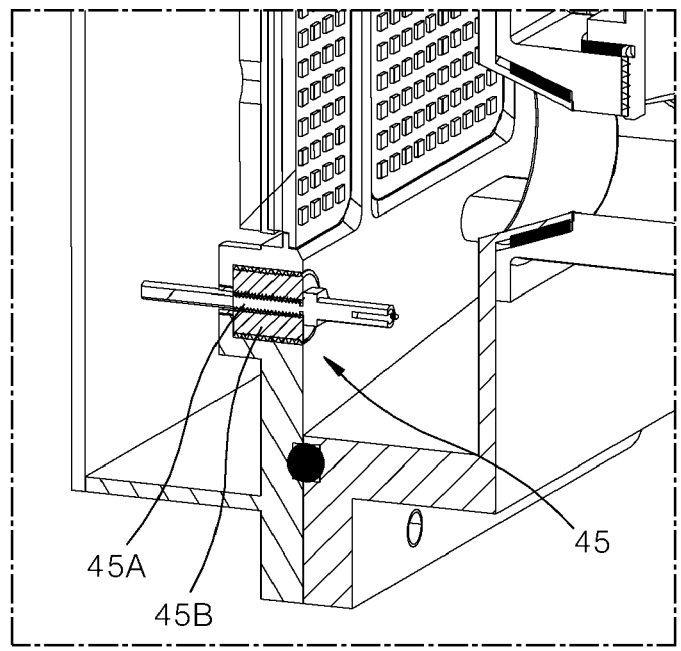
FIG. 9 is a cut-away perspective view illustrating a detailed configuration of a pump wire fastening unit illustrated in FIG. 8.

FIG. 9 is a cut-away perspective view illustrating a detailed configuration of the pump wire fastening unit illustrated in FIG. 8.

Referring to FIGS. 8 and 9, the pump wire fastening unit 45 may include an inner fastening member 45A and an outer fastening member 45B. The electric wire of the pump 41 may penetrate forward and rearward the inside of the inner fastening member 45A and be connected to the printed circuit board.

A fastening groove into which the outer fastening member 45B is inserted may be formed in the rear surface of the partition frame 70. A plurality of first fastening protrusions having a serrated shape may be formed on an inner peripheral surface of the fastening groove. In addition, a plurality of second fastening protrusions having a serrated shape may be formed on an outer peripheral surface of the outer fastening member 45B and fastened to the plurality of first fastening protrusions. The inner fastening member 45A may penetrate forward and rearward a center of the outer fastening member 45B. In addition, the inner fastening member 45A may penetrate a front partition wall of the fastening groove. A plurality of third fastening protrusions having a serrated shape may be formed on an inner peripheral surface of the outer fastening member 45B. In addition, a plurality of fourth fastening protrusions having a serrated shape may be formed on an outer peripheral surface of the inner fastening member 45A and fastened to the plurality of third fastening protrusions.

The plurality of first fastening protrusions and the plurality of second fastening protrusions may be spirally formed so as to be fastened by a method identical to a method of fastening a bolt. Likewise, the plurality of third fastening protrusions and the plurality of fourth fastening protrusions may also be spirally formed so as to be fastened by a method identical to a method of fastening a bolt.

Figure 10:
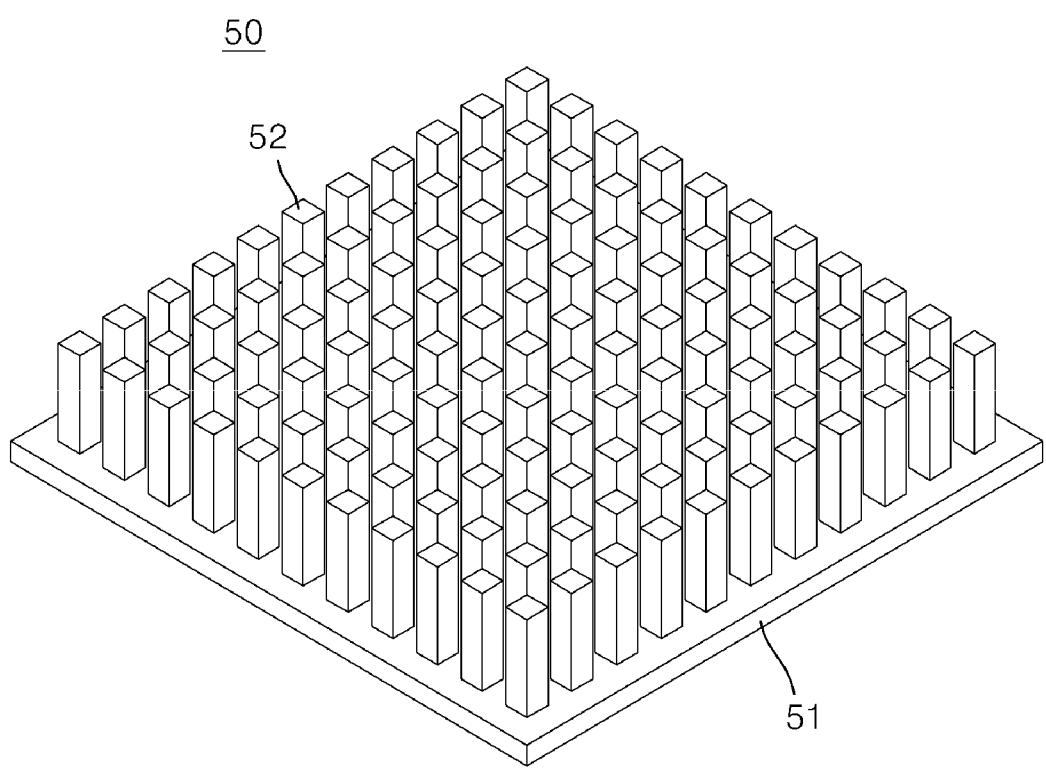
FIG. 10 is a perspective view illustrating one embodiment of the heat exchange member illustrated in FIG. 5.

FIG. 10 is a perspective view illustrating one embodiment of the heat exchange member illustrated in FIG. 5.

Referring to FIGS. 8 and 10, the heat exchange member 50 may be made of a material excellent in thermal conductivity. For example, the heat exchange member 50 may be made of copper.

The heat exchange member 50 may include a body 51 and a plurality of heat exchange protrusions 52. However, the heat exchange member 50 may include a plurality of heat exchange grooves (not illustrated) instead of the plurality of heat exchange protrusions 52.

The body 51 may have a plate shape. In the present embodiment, the body 51 has a quadrangular plate shape. However, the body 51 may have a circular plate shape or a polygonal plate shape.

The body 51 may be coupled to the rear surface of the partition frame 70.

The plurality of heat exchange protrusions 52 may protrude from one surface of the body 51. That is, the plurality of heat exchange protrusions 52 may protrude rearward from the rear surface of the body 51.

The heat exchange protrusion 52 may have a bar shape having a quadrangular cross-section. However, the heat exchange protrusion 52 may have a bar shape having a circular cross-section or a bar shape having a polygonal cross-section.

In addition, in a case in which the heat exchange groove is formed in the rear surface of the body 51 instead of the heat exchange protrusion 52, the heat exchange groove may have a bar shape debossed in the body and having a polygonal cross-section. Alternatively, the heat exchange groove may have a bar shape debossed in the body and having a circular cross-section.

Because the heat exchange member 50 includes the plurality of heat exchange protrusions 52, an overall surface of the heat exchange member 50 is widened. Therefore, a large amount of refrigerant sprayed by the spray unit 30 may be adsorbed to the heat exchange member 50, such that the heat exchange member 50 may quickly evaporate the refrigerant sprayed by the spray unit 30.

Body insertion grooves 75 may be formed in the rear surface of the partition frame 70 that faces the second chamber C2. The body 51 may be inserted into the body insertion groove 75. The body insertion groove 75 may have the same shape as the body 51. In the present embodiment, because the body 51 has a quadrangular plate, the body insertion groove 75 has a quadrangular plate.

The number of body insertion grooves 75 may be equal to the number of heat exchange members 50. The body insertion grooves 75 may be disposed at positions corresponding to the positions of the heat exchange members 50.

That is, the body insertion grooves 75 may include a plurality of first body insertion grooves 75A, a plurality of second body insertion grooves 75B, a plurality of third body insertion grooves 75C, a plurality of fourth body insertion grooves 75D, a plurality of fifth body insertion grooves 75E, a plurality of sixth body insertion grooves 75F, and a plurality of seventh body insertion grooves 75G.

The plurality of first body insertion grooves 75A, the plurality of second body insertion grooves 75B, the plurality of third body insertion grooves 75C, the plurality of fourth body insertion grooves 75D, the plurality of fifth body insertion grooves 75E, the plurality of sixth body insertion grooves 75F, and the plurality of seventh body insertion grooves 75G may be disposed to be spaced apart from one another in the upward/downward direction.

The bodies 51 of the plurality of first heat exchange members 50A may be respectively inserted into the plurality of first body insertion grooves 75A.

The plurality of first body insertion grooves 75A may be disposed at the uppermost side among the body insertion grooves 75. The plurality of first body insertion grooves 75A may be disposed above the plurality of second body insertion grooves 75B.

The bodies 51 of the plurality of second heat exchange members 50B may be respectively inserted into the plurality of second body insertion grooves 75B.

The plurality of second body insertion grooves 75B may be disposed below the plurality of first body insertion grooves 75A. The plurality of second body insertion grooves 75B may be disposed above the plurality of third body insertion grooves 75C. The plurality of second body insertion grooves 75B may be disposed between the plurality of first body insertion grooves 75A and the plurality of third body insertion grooves 75C.

The bodies 51 of the plurality of third heat exchange members 50C may be respectively inserted into the plurality of third body insertion grooves 75C.

The plurality of third body insertion grooves 75C may be disposed below the plurality of second body insertion grooves 75B. The plurality of third body insertion grooves 75C may be disposed above the plurality of fourth body insertion grooves 75D. The plurality of third body insertion grooves 75C may be disposed between the plurality of second body insertion grooves 75B and the plurality of fourth body insertion grooves 75D.

The bodies 51 of the plurality of fourth heat exchange members 50D may be respectively inserted into the plurality of fourth body insertion grooves 75D.

The plurality of fourth body insertion grooves 75D may be disposed below the plurality of third body insertion grooves 75C. The plurality of fourth body insertion grooves 75D may be disposed above the plurality of fifth body insertion grooves 75E. The plurality of fourth body insertion grooves 75D may be disposed between the plurality of third body insertion grooves 75C and the plurality of fifth body insertion grooves 75E.

The bodies 51 of the plurality of fifth heat exchange members 50E may be respectively inserted into the plurality of fifth body insertion grooves 75E.

The plurality of fifth body insertion grooves 75E may be disposed below the plurality of fourth body insertion grooves 75D. The plurality of fifth body insertion grooves 75E may be disposed above the plurality of sixth body insertion grooves 75F. The plurality of fifth body insertion grooves 75E may be disposed between the plurality of fourth body insertion grooves 75D and the plurality of sixth body insertion grooves 75F.

The bodies 51 of the plurality of sixth heat exchange members 50F may be respectively inserted into the plurality of sixth body insertion grooves 75F.

The plurality of sixth body insertion grooves 75F may be disposed below the plurality of fifth body insertion grooves 75E. The plurality of sixth body insertion grooves 75F may be disposed above the plurality of seventh body insertion grooves 75G. The plurality of sixth body insertion grooves 75F may be disposed between the plurality of fifth body insertion grooves 75E and the plurality of seventh body insertion grooves 75G.

The bodies 51 of the plurality of seventh heat exchange members 50G may be respectively inserted into the plurality of seventh body insertion grooves 75G.

The plurality of seventh body insertion grooves 75G may be disposed at the lowermost side among the body insertion grooves 75. The plurality of seventh body insertion grooves 75G may be disposed below the plurality of sixth body insertion grooves 75F.

Figure 11:
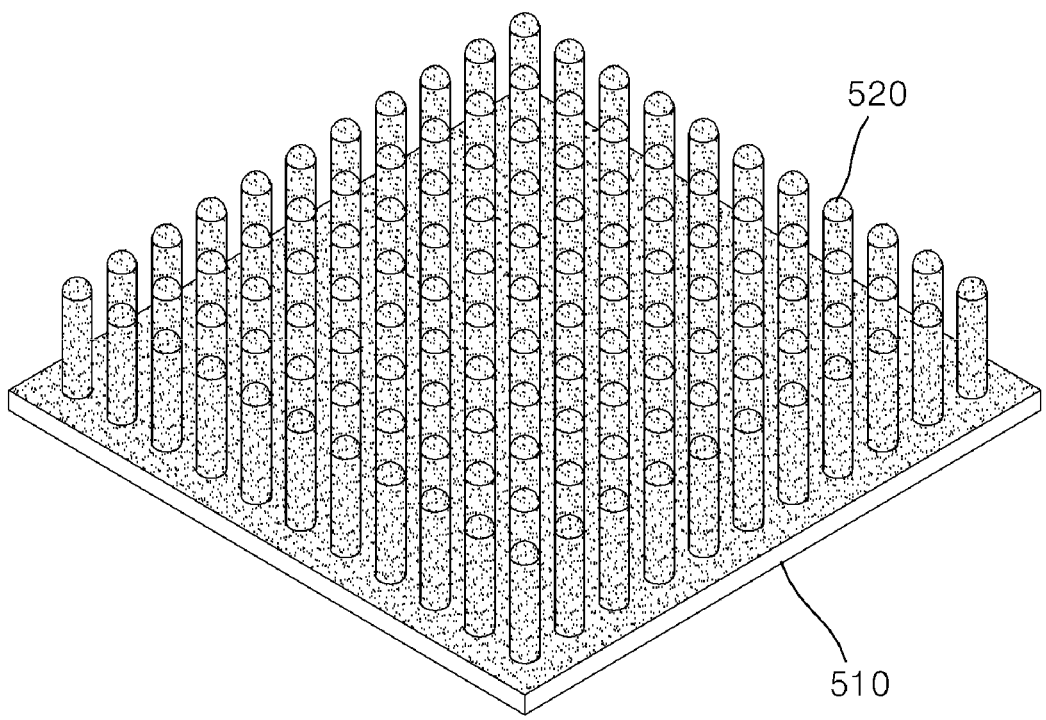
FIG. 11 is a perspective view illustrating another embodiment of the heat exchange member illustrated in FIG. 5.

FIG. 11 is a perspective view illustrating another embodiment of the heat exchange member illustrated in FIG. 5.

Referring to FIG. 11, a heat exchange member 500 may include a body 510 and a plurality of heat exchange protrusions 520.

The heat exchange member 500 may be configured as a porous powder sintered body. That is, as illustrated in FIG. 10, a porous body may be formed by sintering the smooth surface of the heat exchange member 50 by using copper powder. Therefore, the heat exchange member 500 having a porous structure may be made as illustrated in FIG. 11. When the heat exchange member 500 is configured as the porous powder sintered body as described above, a surface area of the heat exchange member 500 increases, and the porous structure increases surface tension, such that the refrigerant sprayed by the spray unit 30 may be easily adsorbed. Therefore, it is possible to improve efficiency in evaporating the adsorbed refrigerant.

Meanwhile, as described above, the plurality of heat dissipation fins 23 are provided on the rear surface of the heat dissipation cover 20 in order to condense the refrigerant evaporated by the heat exchange members 50. However, the condensing structure for condensing the refrigerant evaporated by the heat exchange members 50 is not limited to the plurality of heat dissipation fins 23. That is, the condensing structure may include condensing units 60 to be described below instead of the plurality of heat dissipation fins 23. The condensing structure may include the condensing units 60 in addition to the plurality of heat dissipation fins 23. Hereinafter, the condensing unit 60 will be described in detail.

Figure 12:
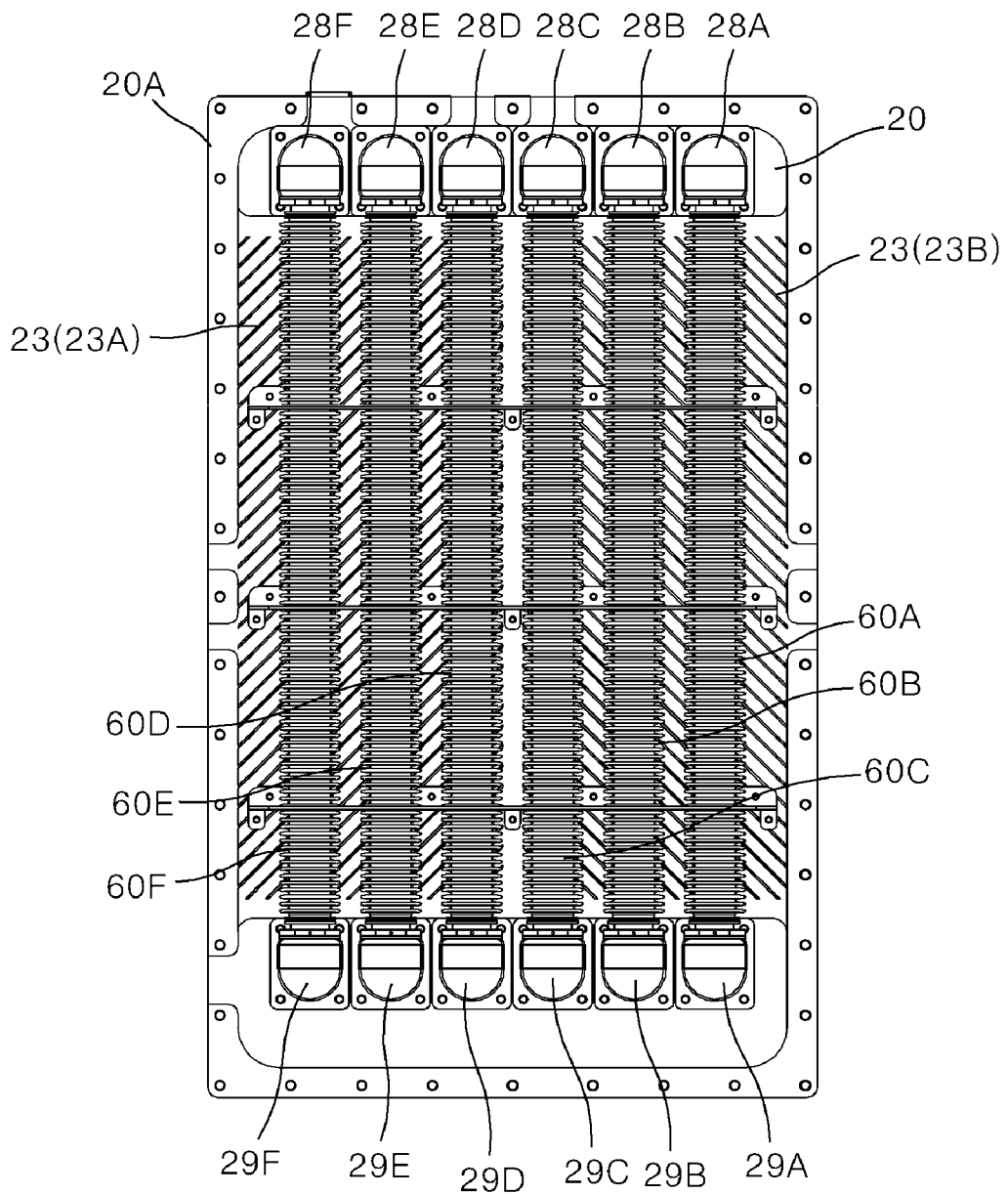
FIG. 12 is a rear view of FIG. 1.
Figure 13:
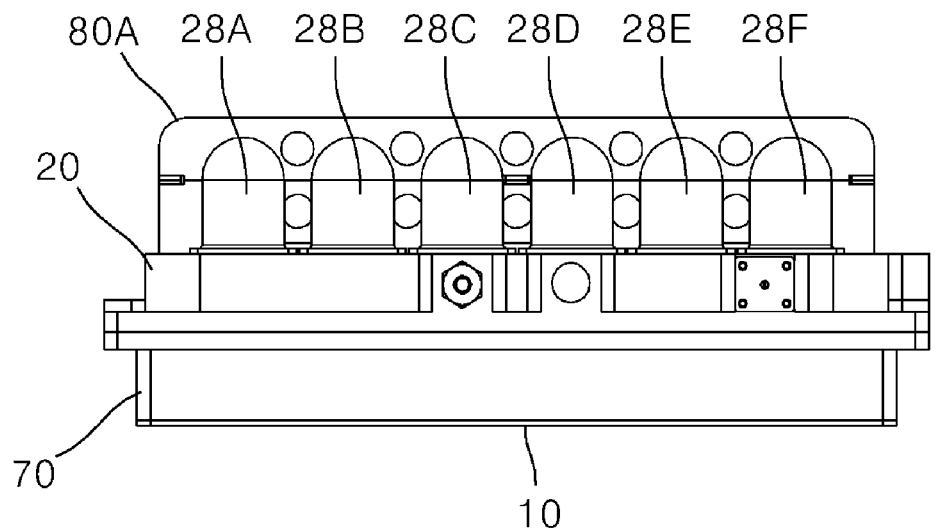
FIG. 13 is a top plan view of FIG. 1.
Figure 14:
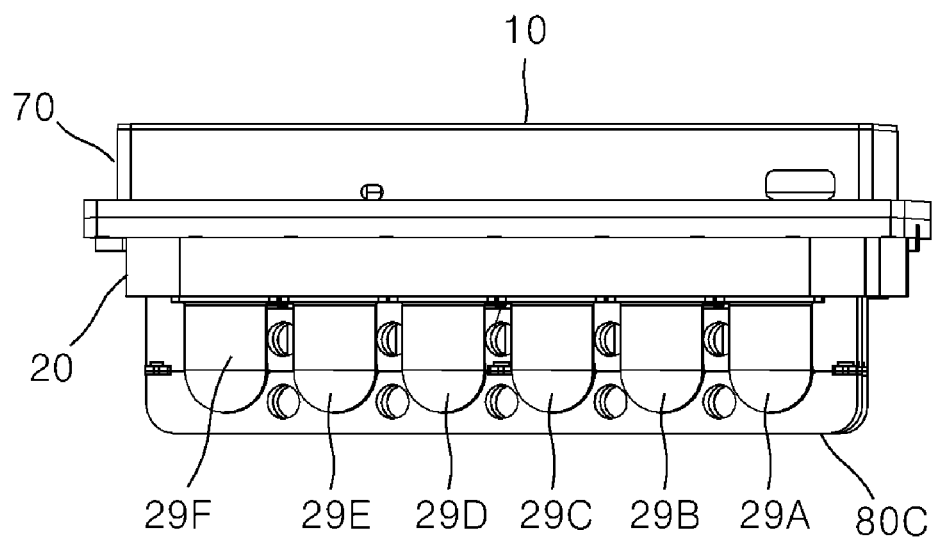
FIG. 14 is a bottom plan view of FIG. 1.

FIG. 12 is a rear view of FIG. 1, FIG. 13 is a top plan view of FIG. 1, and FIG. 14 is a bottom plan view of FIG. 1.

Referring to FIGS. 1, 2, and 12 to 14, the cooling apparatus for an electronic element according to the embodiment of the present invention may further include the condensing units 60.

The condensing unit 60 may be disposed outside the heat dissipation cover 20. The condensing unit 60 may be disposed on the rear surface of the heat dissipation cover 20. The condensing unit 60 may condense the evaporated refrigerant in the second chamber C2 and supply the refrigerant to the refrigerant supply unit 40. That is, the condensing unit 60 may condense the evaporated refrigerant in the second chamber C2 and supply the refrigerant to the pump 41.

The condensing unit 60 may have a tubular shape. The evaporated refrigerant in the second chamber C2 may be introduced into the condensing unit 60, condensed while passing through the condensing unit 60, and then supplied to the pump 41.

The condensing unit 60 may have a bellows shape. Therefore, because the condensing unit 60 has a plurality of pleats, a surface area being in contact with outside air increases, such that condensing performance may be improved.

Outflow units 28 may protrude from an upper portion of the heat dissipation cover 20, and inflow units 29 may protrude from a lower portion of the heat dissipation cover 20. The evaporated refrigerant in the second chamber C2 may flow out through the outflow unit 28. The refrigerant condensed by the condensing unit 60 may flow into the second chamber C2 through the inflow unit 29.

Because the refrigerant evaporated in the second chamber C2 is in a gaseous state, the refrigerant flows upward in the second chamber C2. Because the condensed refrigerant in the second chamber C2 is in a liquid state, the refrigerant flows downward in the second chamber C2. Therefore, the outflow unit 28 may be positioned on the upper portion of the heat dissipation cover 20, and the inflow unit 29 may be positioned on the lower portion of the heat dissipation cover 20, such that the evaporated refrigerant in a gaseous state may easily flow out of the inside of the second chamber C2, and the condensed refrigerant in a liquid state may easily flow into the pump 41.

The condensing unit 60 may connect the outflow unit 28 and the inflow unit 29. That is, an upper end of the condensing unit 60 may be connected to the outflow unit 28, and a lower end of the condensing unit 60 may be connected to the inflow unit 29. The upper end of the condensing unit 60 may be coupled to the lower end of the outflow unit 28 by welding, and the lower end of the condensing unit 60 may be coupled to the upper end of the inflow unit 29 by welding. Of course, the upper end of the condensing unit 60 may be coupled to the outflow unit 28 by bolting or mechanical coupling instead of welding. In addition, the lower end of the condensing unit 60 may also be coupled to the upper end of the inflow unit 29 by bolting or mechanical coupling instead of welding. Because the condensing unit 60 connects the outflow unit 28 and the inflow unit 29, the evaporated refrigerant in the second chamber C2, which flows out through the outflow unit 28, may be condensed while passing through the condensing unit 60 and then supplied to the pump 41 through the inflow unit 29. The condensing unit 60 may be made of stainless steel.

The outflow unit 28 may protrude from the upper portion of the rear surface of the heat dissipation cover 20, and the inflow unit 29 may protrude from the lower portion of the rear surface of the heat dissipation cover 20. The outflow unit 28 may be provided separately from the heat dissipation cover 20 and installed on the upper portion of the rear surface of the heat dissipation cover 20 by means of a fastening member so as to communicate with a hole formed in the upper portion of the rear surface of the heat dissipation cover 20. Likewise, the inflow unit 29 may be provided separately from the heat dissipation cover 20 and installed on the upper portion of the rear surface of the heat dissipation cover 20 by means of a fastening member so as to communicate with a hole formed in the lower portion of the rear surface of the heat dissipation cover 20. Of course, the outflow unit 28 and the inflow unit 29 may be coupled to the rear surface of the heat dissipation cover 20 by welding without using a fastening member.

The outflow unit 28 and the inflow unit 29 may be made of aluminum that is the material identical to the material of the heat dissipation cover 20. Of course, the outflow unit 28 and the inflow unit 29 may be made of copper. However, if the outflow unit 28 and the inflow unit 29 are made of copper, the outflow unit 28 and the inflow unit 29 are not easily coupled to the condensing unit 60 made of stainless steel by welding. Therefore, the outflow unit 28 and the inflow unit 29 may be made of aluminum so that the outflow unit 28 and the inflow unit 29 are easily coupled to the condensing unit 60 made of stainless steel by welding and appropriately transfer the heat from the heat dissipation cover 20.

The outflow unit 28 may have a shape protruding rearward and then bent downward. The inflow unit 29 may have a shape protruding rearward and then bent upward.

The condensing unit 60, the outflow unit 28, and the inflow unit 29 may be provided in plural. The condensing units 60, the outflow units 28, and the inflow units 29 may be equal in number to one another. The plurality of condensing units 60, the plurality of outflow units 28, and the plurality of inflow units 29 may be spaced apart from one another in the leftward/rightward direction. The condensing unit 60, the outflow unit 28, and the inflow unit 29 may be disposed on a straight line when viewed from the rear side of the heat dissipation cover 20.

In the present embodiment, the condensing units 60 are configured as six condensing units 60. However, the number of condensing units 60 is not limited thereto.

The plurality of condensing units 60 may include a first condensing unit 60A, a second condensing unit 60B, a third condensing unit 60C, a fourth condensing unit 60D, a fifth condensing unit 60E, and a sixth condensing unit 60F.

The first condensing unit 60A, the second condensing unit 60B, the third condensing unit 60C, the fourth condensing unit 60D, the fifth condensing unit 60E, and the sixth condensing unit 60F may be spaced apart from one another in the leftward/rightward direction. Of course, in addition, the present invention is not limited to the configuration in which the plurality of condensing units 60 are spaced apart from one another in the leftward/rightward direction. The plurality of condensing units 60 may be disposed to overlap one another in the forward/rearward direction.

The first condensing unit 60A may be disposed at the rightmost side among the condensing units 60. The first condensing unit 60A may be disposed rightward of the second condensing unit 60B.

The second condensing unit 60B may be disposed leftward of the first condensing unit 60A. The second condensing unit 60B may be disposed rightward of the third condensing unit 60C. The second condensing unit 60B may be disposed between the first condensing unit 60A and the third condensing unit 60C.

The third condensing unit 60C may be disposed leftward of the second condensing unit 60B. The third condensing unit 60C may be disposed rightward of the fourth condensing unit 60D. The third condensing unit 60C may be disposed between the second condensing unit 60B and the fourth condensing unit 60D.

The fourth condensing unit 60D may be disposed leftward of the third condensing unit 60C. The fourth condensing unit 60D may be disposed rightward of the fifth condensing unit 60E. The fourth condensing unit 60D may be disposed between the third condensing unit 60C and the fifth condensing unit 60E.

The fifth condensing unit 60E may be disposed leftward of the fourth condensing unit 60D. The fifth condensing unit 60E may be disposed rightward of the sixth condensing unit 60F. The fifth condensing unit 60E may be disposed between the fourth condensing unit 60D and the sixth condensing unit 60F.

The sixth condensing unit 60F may be disposed at the leftmost side among the condensing units 60. The sixth condensing unit 60F may be disposed leftward of the fifth condensing unit 60E.

The outflow units 28 may include a first outflow unit 28A, a second outflow unit 28B, a third outflow unit 28C, a fourth outflow unit 28D, a fifth outflow unit 28E, and a sixth outflow unit 28F.

An upper end of the first condensing unit 60A may be connected to the first outflow unit 28A.

The first outflow unit 28A may be disposed at the rightmost side among the outflow units 28. The first outflow unit 28A may be disposed rightward of the second outflow unit 28B.

An upper end of the second condensing unit 60B may be connected to the second outflow unit 28B.

The second outflow unit 28B may be disposed leftward of the first outflow unit 28A. The second outflow unit 28B may be disposed rightward of the third outflow unit 28C. The second outflow unit 28B may be disposed between the first outflow unit 28A and the third outflow unit 28C.

An upper end of the third condensing unit 60C may be connected to the third outflow unit 28C.

The third outflow unit 28C may be disposed leftward of the second outflow unit 28B. The third outflow unit 28C may be disposed rightward of the fourth outflow unit 28D. The third outflow unit 28C may be disposed between the second outflow unit 28B and the fourth outflow unit 28D.

An upper end of the fourth condensing unit 60D may be connected to the fourth outflow unit 28D.

The fourth outflow unit 28D may be disposed leftward of the third outflow unit 28C. The fourth outflow unit 28D may be disposed rightward of the fifth outflow unit 28E. The fourth outflow unit 28D may be disposed between the third outflow unit 28C and the fifth outflow unit 28E.

An upper end of the fifth condensing unit 60E may be connected to the fifth outflow unit 28E.

The fifth outflow unit 28E may be disposed leftward of the fourth outflow unit 28D. The fifth outflow unit 28E may be disposed rightward of the sixth outflow unit 28F. The fifth outflow unit 28E may be disposed between the fourth outflow unit 28D and the sixth outflow unit 28F.

An upper end of the sixth condensing unit 60F may be connected to the sixth outflow unit 28F.

The sixth outflow unit 28F may be disposed at the leftmost side among the outflow units 28. The sixth outflow unit 28F may be disposed leftward of the fifth outflow unit 28E.

The inflow units 29 may include a first inflow unit 29A, a second inflow unit 29B, a third inflow unit 29C, a fourth inflow unit 29D, a fifth inflow unit 29E, and a sixth inflow unit 29F.

A lower end of the first condensing unit 60A may be connected to the first inflow unit 29A.

The first inflow unit 29A may be disposed at the rightmost side among the inflow units 29. The first inflow unit 29A may be disposed rightward of the second inflow unit 29B.

A lower end of the second condensing unit 60B may be connected to the second inflow unit 29B.

The second inflow unit 29B may be disposed leftward of the first inflow unit 29A. The second inflow unit 29B may be disposed rightward of the third inflow unit 29C. The second inflow unit 29B may be disposed between the first inflow unit 29A and the third inflow unit 29C.

A lower end of the third condensing unit 60C may be connected to the third inflow unit 29C.

The third inflow unit 29C may be disposed leftward of the second inflow unit 29B. The third inflow unit 29C may be disposed rightward of the fourth inflow unit 29D. The third inflow unit 29C may be disposed between the second inflow unit 29B and the fourth inflow unit 29D.

A lower end of the fourth condensing unit 60D may be connected to the fourth inflow unit 29D.

The fourth inflow unit 29D may be disposed leftward of the third inflow unit 29C. The fourth inflow unit 29D may be disposed rightward of the fifth inflow unit 29E. The fourth inflow unit 29D may be disposed between the third inflow unit 29C and the fifth inflow unit 29E.

A lower end of the fifth condensing unit 60E may be connected to the fifth inflow unit 29E.

The fifth inflow unit 29E may be disposed leftward of the fourth inflow unit 29D. The fifth inflow unit 29E may be disposed rightward of the sixth inflow unit 29F. The fifth inflow unit 29E may be disposed between the fourth inflow unit 29D and the sixth inflow unit 29F.

A lower end of the sixth condensing unit 60F may be connected to the sixth inflow unit 29F.

The sixth inflow unit 29F may be disposed at the leftmost side among the inflow units 29. The sixth inflow unit 29F may be disposed leftward of the fifth inflow unit 29E.

Meanwhile, mounting brackets 80 may be installed outside the heat dissipation cover 20. The mounting bracket 80 may be coupled to the rear surface of the heat dissipation cover 20 and support the condensing units 60. In the case in which the condensing unit 60 has a bellows shape, the condensing unit 60 may be bent toward one side while being swayed by a pressure of the refrigerant when the refrigerant vaporized in the second chamber C2 flows into the condensing unit 60 through the outflow unit 28. To prevent this situation, the mounting bracket 80 may support the condensing unit 60.

A through-hole may be formed in the mounting bracket 80, and the condensing unit 60 may vertically penetrate the through-hole. The mounting brackets 80 may include a plurality of mounting brackets 80 spaced apart from one another in the upward/downward direction.

The plurality of mounting brackets 80 may include a first mounting bracket 80A, a second mounting bracket 80B, and a third mounting bracket 80C.

The first mounting bracket 80A may be disposed at the uppermost side among the mounting brackets 80. The first mounting bracket 80A may be disposed above the second mounting bracket 80B.

The second mounting bracket 80B may be disposed below the first mounting bracket 80A. The second mounting bracket 80B may be disposed above the third mounting bracket 80C. The second mounting bracket 80B may be disposed between the first mounting bracket 80A and the third mounting bracket 80C.

The third mounting bracket 80C may be disposed at the lowermost side among the mounting brackets 80. The third mounting bracket 80C may be disposed below the second mounting bracket 80B.

The first mounting bracket 80A, the second mounting bracket 80B, and the third mounting bracket 80C may each be made by welding two members. That is, any one of the two members may define a part of the through-hole, and the other of the two members may define the remaining part of the through-hole. Any one of the two members is coupled to the rear surface of the heat dissipation cover 20 first, the condensing unit 60 is inserted into a part of the through-hole, and then the other of the two members is welded to one of the two members. Therefore, a part of the through-hole and the remaining part of the through-hole may surround the condensing unit 60. Of course, the present invention is not limited to the configuration in which the two members are welded. The two members may be coupled to each other by bolting or mechanical coupling.

In the cooling apparatus for an electronic element according to the embodiment of the present invention configured as described above, the refrigerant supply unit 40 supplies the condensed refrigerant in the second chamber C2 to the spray unit 30, the spray unit 30 sprays the refrigerant, which is supplied from the refrigerant supply unit 40, into the second chamber C2, and the heat exchange member 50 of the evaporation unit 100 evaporates the refrigerant sprayed by the spray unit 30.

The refrigerant evaporated in the second chamber C2 may be condensed by the plurality of heat dissipation fins 23 and/or the condensing unit 60 and then moved to the pump 41 of the refrigerant supply unit 40, and the refrigerant supply unit 40 may supply the condensed refrigerant back to the spray unit 30.

The above-mentioned processes are repeated to quickly dissipate the heat generated by the heat-generating element.

As described above, in the cooling apparatus for an electronic element according to the embodiment of the present invention, the spray unit 30 sprays the refrigerant, which is supplied by the refrigerant supply unit 40 and condensed in the second chamber C2, into the second chamber C2 in a vacuum state, and the evaporation unit 100 evaporates the refrigerant, which is sprayed into the second chamber C2 by the spray unit 30, by using the sensible heat transferred from the first chamber C1 to the evaporation unit 100 and using the latent heat transferred from the evaporation unit 100 to the second chamber C2. Therefore, it is possible to quickly dissipate the heat, which is generated by the heat-generating element mounted on the printed circuit board disposed in the first chamber C1, by using a phase change of the refrigerant. Further, because it is not necessary to install a large number of mechanical air-cooled heat dissipation structures, the size of the cooling apparatus may decrease.

It may be understood by a person skilled in the art that the present invention may be carried out in other specific forms without changing the technical spirit or the essential characteristics of the present invention. Therefore, it should be understood that the above-described embodiments are illustrative in all aspects and do not limit the present invention. The scope of the present invention is represented by the claims to be described below rather than the detailed description, and it should be interpreted that the meaning and scope of the claims and all the changes or modified forms derived from the equivalent concepts thereto fall within the scope of the present invention.

INDUSTRIAL APPLICABILITY

The present invention provides a cooling apparatus for an electronic element having improved heat dissipation performance while minimizing the size.

The invention claimed is:

1. A cooling apparatus for an electronic element, the cooling apparatus comprising:
    a first chamber in a non-vacuum state, the first chamber being configured such that a printed circuit board equipped with a heat-generating element is disposed in the first chamber;
    a second chamber in a vacuum state, the second chamber being configured such that a spray unit configured to spray a refrigerant and a refrigerant supply unit configured to supply the refrigerant to the spray unit are disposed in the second chamber; and
    an evaporation unit disposed between the first chamber and the second chamber,
    wherein the spray unit sprays the refrigerant, which is supplied by the refrigerant supply unit and condensed in the second chamber, into the second chamber, and
    wherein the evaporation unit evaporates the refrigerant, which is sprayed into the second chamber by the spray unit, by using sensible heat transferred from the first chamber to the evaporation unit and latent heat transferred from the evaporation unit to the second chamber.

2. The cooling apparatus of claim 1, wherein the evaporation unit comprises:
    a partition frame configured to separate the first chamber and the second chamber; and
    a heat exchange member coupled to the partition frame, disposed in the second chamber, and configured to evaporate the refrigerant, which is sprayed into the second chamber by the spray unit, by using the sensible heat and the latent heat.

3. The cooling apparatus of claim 2, further comprising:
    a radome disposed on one surface of the partition frame; and
    a heat dissipation cover disposed on the other surface of the partition frame,
    wherein the first chamber is provided between the partition frame and the radome, and
    wherein the second chamber is provided between the partition frame and the heat dissipation cover.

4. The cooling apparatus of claim 3, wherein a plurality of heat dissipation fins protrude from an outer surface of the heat dissipation cover that corresponds to the other surface of the partition frame.

5. The cooling apparatus of claim 3, further comprising:
    a condensing unit disposed outside the heat dissipation cover, having a tubular shape, and configured to condense the evaporated refrigerant in the second chamber and supply the refrigerant to the refrigerant supply unit.

6. The cooling apparatus of claim 5, wherein the condensing unit has a bellows shape.

7. The cooling apparatus of claim 5, further comprising:
    a mounting bracket disposed outside the heat dissipation cover and having a through-hole penetrated by the condensing unit.

8. The cooling apparatus of claim 5, wherein an outflow unit protrudes from an upper portion of the heat dissipation cover and is configured such that the evaporated refrigerant in the second chamber flows out through the outflow unit,
    wherein an inflow unit protrudes from a lower portion of the heat dissipation cover and is configured such that the refrigerant condensed by the condensing unit flows into the second chamber through the inflow unit, and
    wherein the condensing unit connects the outflow unit and the inflow unit.

9. The cooling apparatus of claim 2, wherein the heat exchange member comprises:
    a plate-shaped body disposed on the partition frame; and
    a plurality of heat exchange protrusions formed on one surface of the body.

10. The cooling apparatus of claim 9, wherein the partition frame has a body insertion groove into which the body is inserted.

11. The cooling apparatus of claim 9, wherein the heat exchange protrusion has a bar shape having a polygonal cross-section.

12. The cooling apparatus of claim 9, wherein the heat exchange protrusion has a bar shape having a circular cross-section.

13. The cooling apparatus of claim 2, wherein the heat exchange member comprises:
    a plate-shaped body disposed on the partition frame; and
    a plurality of heat exchange grooves formed in one surface of the body.

14. The cooling apparatus of claim 13, wherein the heat exchange groove has a bar shape debossed in the body and having a polygonal cross-section.

15. The cooling apparatus of claim 13, wherein the heat exchange groove has a bar shape debossed in the body and having a circular cross-section.

16. The cooling apparatus of claim 2, wherein the heat exchange member is configured as a porous powder sintered body.

17. The cooling apparatus of claim 2, further comprising:
- a vacuum gauge configured to create a vacuum in the second chamber; and
- a manometer configured to measure a pressure in the second chamber.

18. The cooling apparatus of claim 1, wherein the heat-generating element comprises at least one of an antenna element configured to transmit and receive a wireless signal and a radio unit (RU) configured to process the wireless signal.

* * * * *